Figure 1:
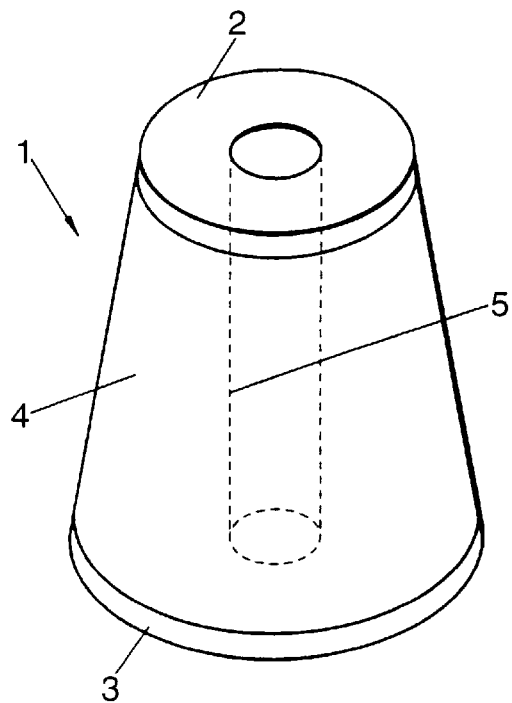

United States Patent
Frosien et al.

[11] Patent Number: 6,051,838
[45] Date of Patent: Apr. 18, 2000

[54] OPTICAL UNIT

[75] Inventors: Jürgen Frosien, Riemerling; Stefan Lanio, Erding; Reinhold Schmitt; Gerald Schönecker, both of Munich, all of Germany

[73] Assignee: ACT Advanced Circuit Testing Gesellschaft fur Testsystementwicklung, Munich, Germany

[21] Appl. No.: 08/947,226

[22] Filed: Oct. 8, 1997

[30] Foreign Application Priority Data

Nov. 19, 1996 [EP] European Pat. Off. .............. 96118539

[51] Int. Cl.[7] ....................................................... H01J 3/18
[52] U.S. Cl. ........................................................ 250/396 R
[58] Field of Search .......................................... 250/396 R

[56] References Cited

U.S. PATENT DOCUMENTS

| | | | |
|---|---|---|---|
| 4,126,781 | 11/1978 | Siegel | 250/396 R |
| 4,556,823 | 12/1985 | Keller et al. | 250/396 R |
| 4,704,532 | 11/1987 | Hua | 250/396 R |
| 4,926,054 | 5/1990 | Frosien | 250/396 R |
| 5,245,194 | 9/1993 | Oae et al. | 250/396 R |

*Primary Examiner*—Jack Berman
*Attorney, Agent, or Firm*—Reising, Ethington, Barnes, Kisselle, Learman & McCulloch, P.C.

[57] ABSTRACT

An optical unit having an electrostatic lens for influencing a particle beam wherein the lens has at least one first and one second electrode downstream of one another in the direction of the particle beam, each of the electrodes being chargeable with a potential and in electrical contact with a high-resistance body having a channel therethrough for the particle beam. A further component is provided for influencing the particle beam in the region of the electrostatic lens.

23 Claims, 12 Drawing Sheets

OPTICAL UNIT

The invention relates to an optical unit for influencing a particle beam. The invention is also directed to a particle beam device with such an optical unit.

BACKGROUND OF THE INVENTION

The most varied electrostatic or combined electrostatic-magnetic arrangements are known in the art for influencing, particularly for focusing a particle beam. In the case of conventional electrostatic lenses arrangements are used with two or more electrodes which are charged with different potentials in order to cause in the space between the electrodes, a field distribution which acts as a lens for the particle beam. In this case the electrodes can be varied in shape and size. There are apertures, ring elements, and electrodes of cylindrical or conical shape. The lens properties such as focus and aberration properties are fixed by the shape and size of the electrodes and the supplied potentials. However, with a limited number of electrodes it is very difficult to generate a complex field distribution.

In the past, therefore, in order to solve this problem multi-electrode configurations have been used, wherein a further parameter is created by each electrode in order to influence the field distribution. The additional electrodes not only necessitate a substantially more difficult mechanical construction but also require additional voltage sources and are therefore very costly.

U.S. Pat. No. 4,126,781 relates to generating shaped electrical fields for use as electrostatic lenses by employing surface currents on resistive materials to shape electrical fields. In particular, this known electrostatic arrangement is applied to improved types of energy analysers with specific application in the field of Secondary Ion Mass Spectrometry.

The object of the invention is to improve the electrostatic arrangement for influencing a particle beam in such a way that a facility for influencing the electrical field distribution is created which is improved over the prior art and which is distinguished by particularly simple and compact production.

SUMMARY OF THE INVENTION

In the electrostatic lenses according to the invention the two electrodes are in electrical contact with a high-resistance body, the body having a channel for the particle beam. In such an electrostatic lens the construction or the electrical field depends in particular upon the shape of the high-resistance body. In this case the body acts as a multiple voltage divider which replaces the plurality of electrodes. The electrostatic lens according to the invention is distinguished by particularly simple and compact production, with which almost any field distribution and thus almost any lens behaviour can be produced, a minimum of electrodes and components as well as voltage supplies being necessary.

According to the invention the electrostatic lens is advantageously combined with further components for influencing the particle beam in the region of the electrostatic lens to form an optical unit. Thus the lens arrangement or optical unit is also of special interest in particular in particle beam devices.

THE DRAWINGS

Figure 2:
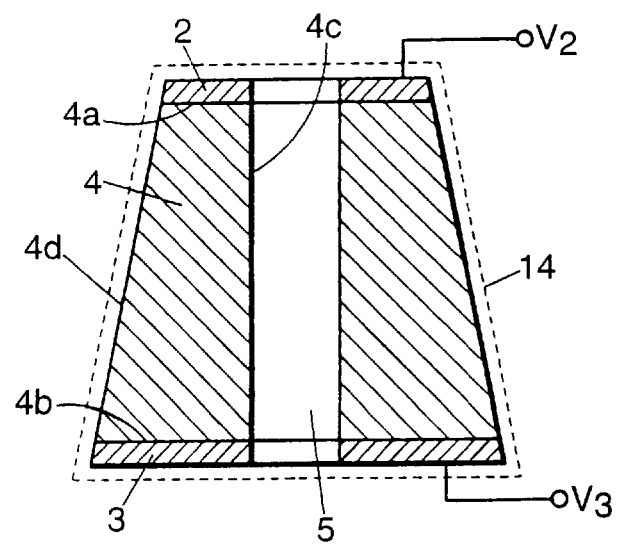
Figure 11:
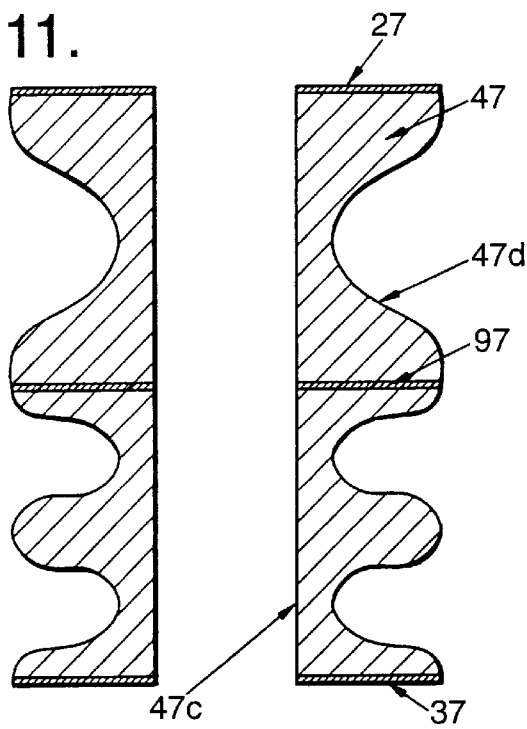
Figure 12:
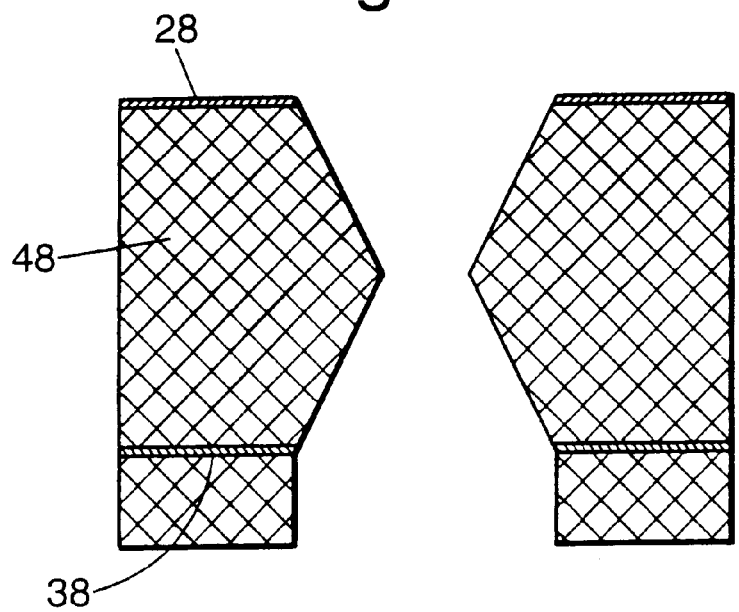
Figure 13:
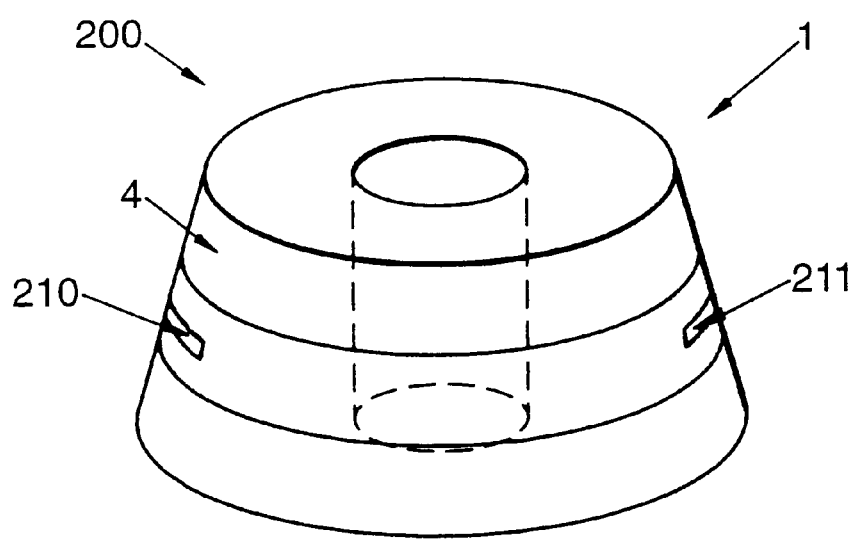
Figure 14:
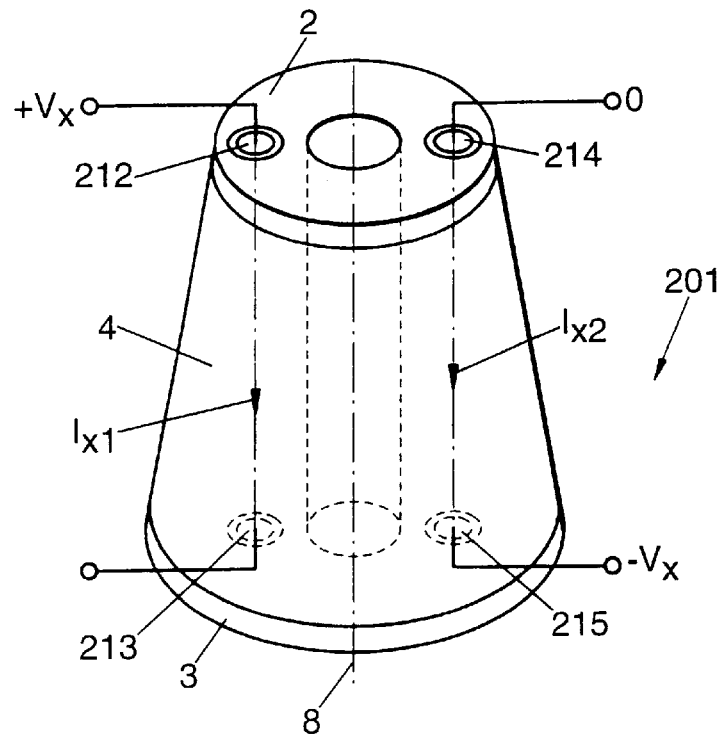
Figure 15:
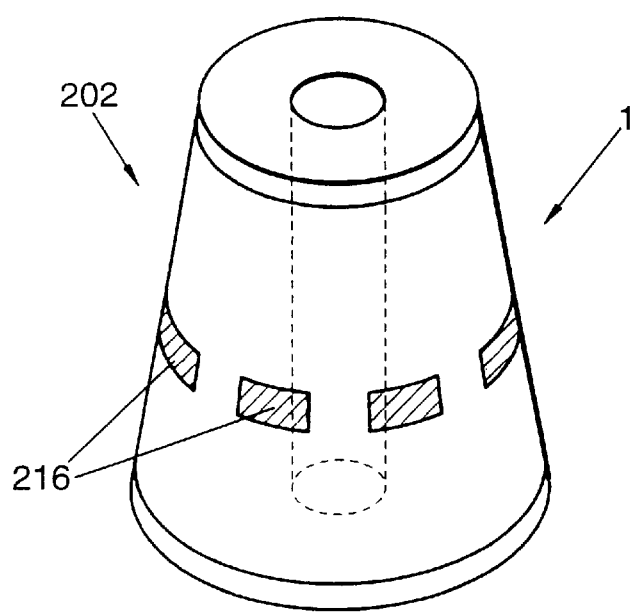
Figure 16:
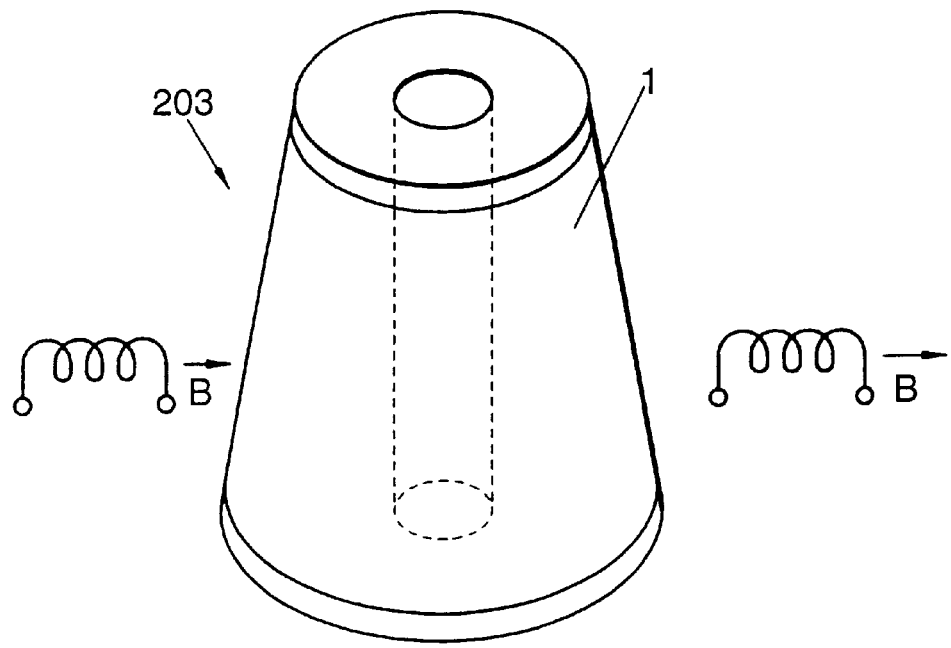
Figure 17:
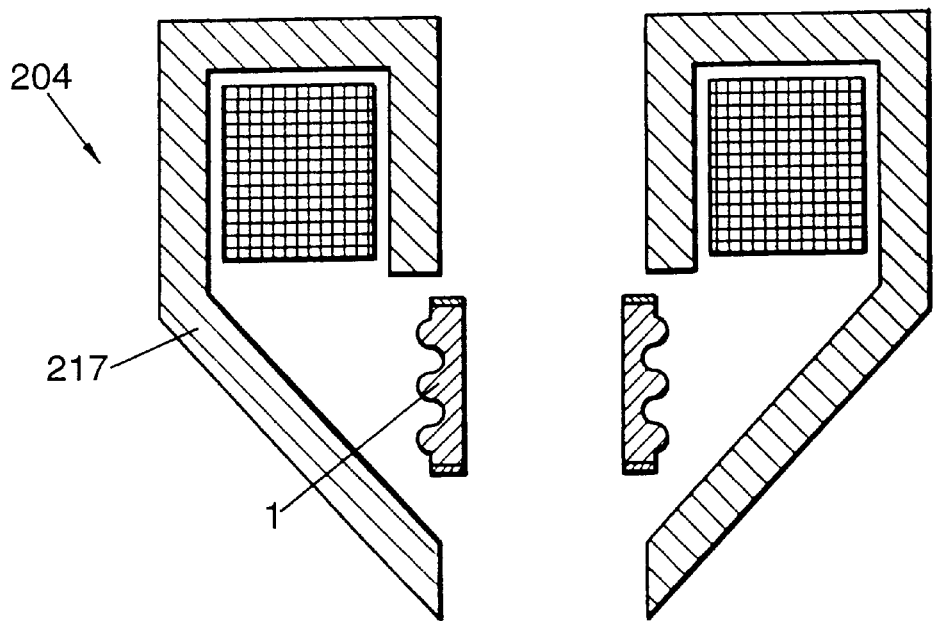
Figure 18:
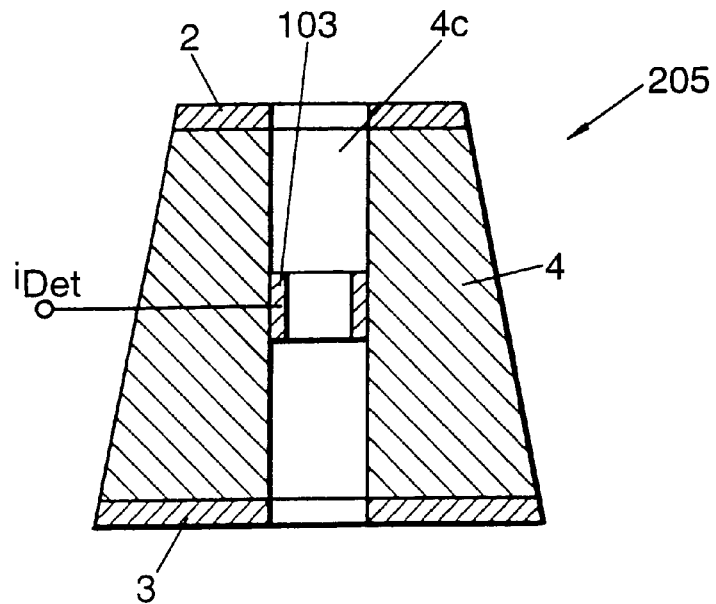
Figure 19:
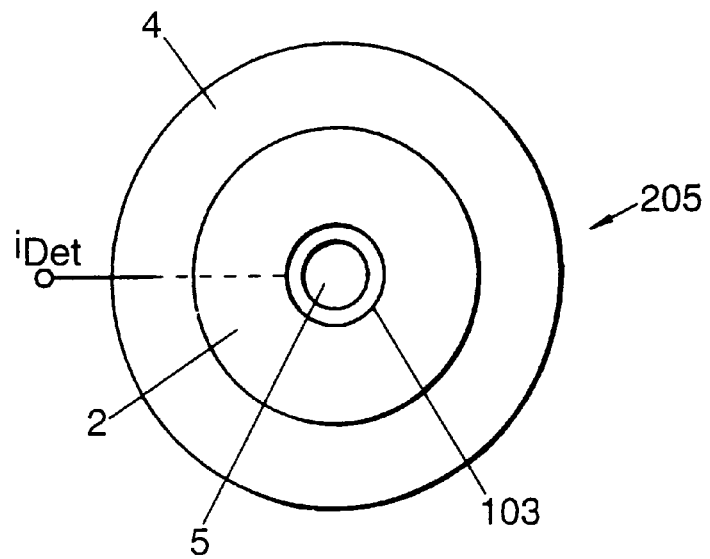
Figure 20:
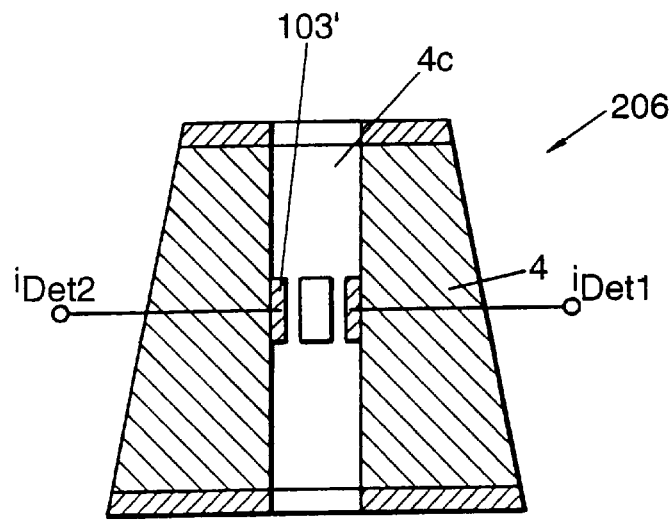
Figure 21:
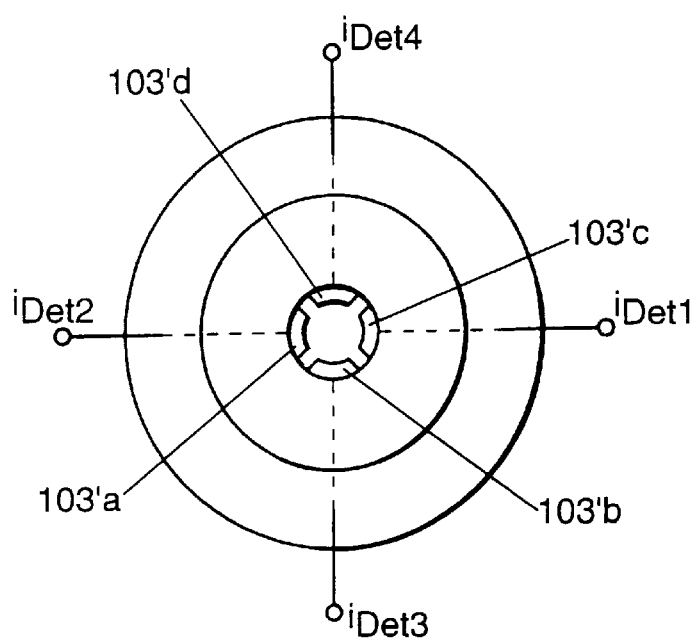
Figure 22:
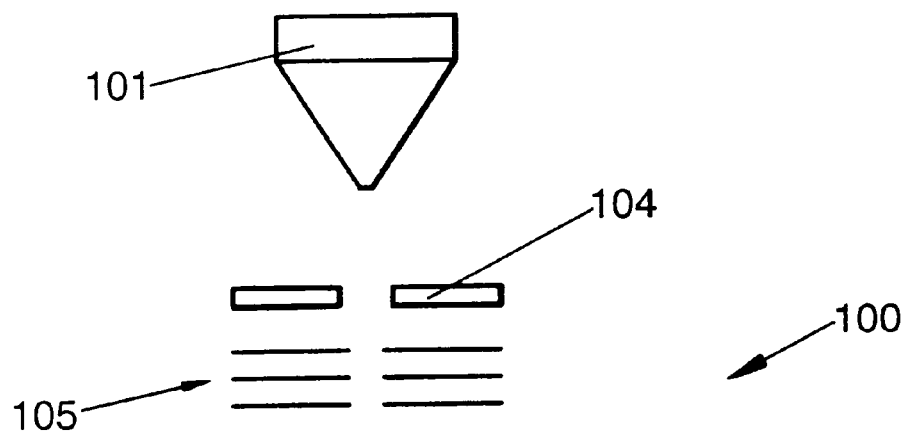
Figure 22:
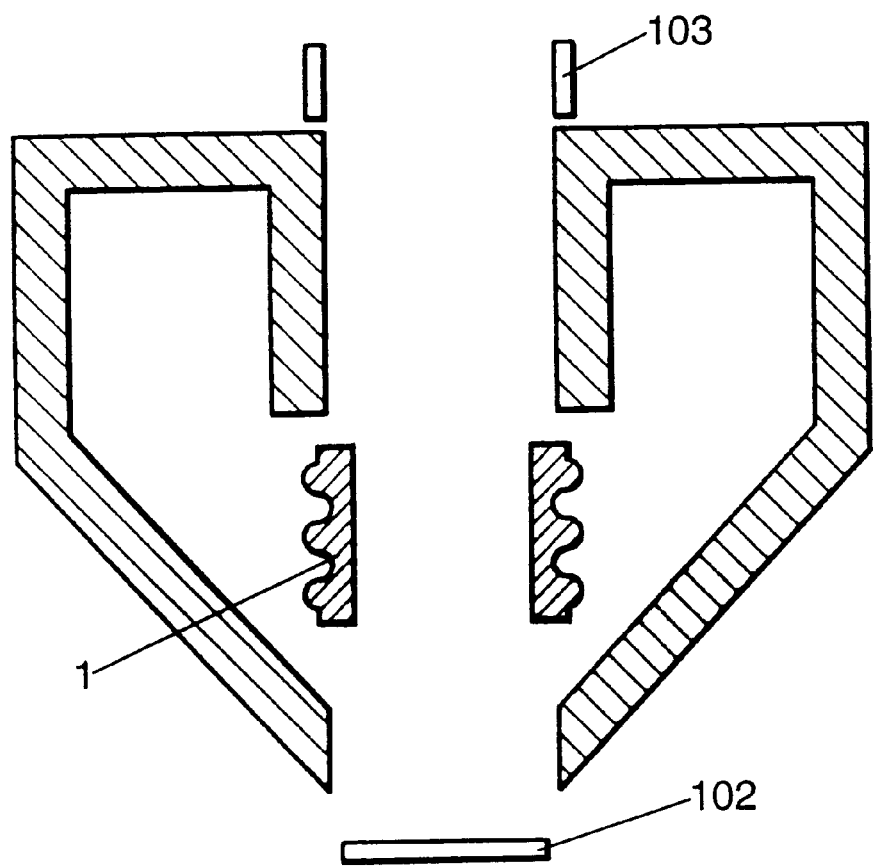

FIG. 1 shows a three-dimensional representation of an electrostatic lens according to a first embodiment, FIG. 2 shows a sectional representation of the embodiment according to FIG. 1, FIGS. 3 to 12 show sectional representations of electrostatic lenses according to further embodiments, FIG. 13 shows a three-dimensional representation of an optical unit, consisting of an electrostatic lens as well as a deflector according to a first embodiment, FIG. 14 shows a three-dimensional representation of an optical unit consisting of an electrostatic lens with a deflector according to the second embodiment, FIG. 15 shows a three-dimensional representation of an optical unit consisting of an electrostatic lens with stigmator, FIG. 16 shows a three-dimensions representation of an optical unit consisting of an electrostatic lens with a deflector according to a third embodiment, FIG. 17 shows a representation of an optical unit consisting of an electrostatic lens as well as a superimposed magnetic lens, FIG. 18 shows a sectional representation of an optical unit consisting of an electrostatic lens as well as a detector according to a first embodiment, FIG. 19 shows a plan view of the optical unit according to FIG. 18, FIG. 20 shows a sectional representation of an optical unit consisting of an electrostatic lens as well as a detector according to a second embodiment, FIG. 21 shows a plan view of the optical unit according to FIG. 20 and FIG. 22 shows a schematic representation of a particle beam device with an electrostatic lens according to the invention.

BACKGROUND OF THE INVENTION

According to the invention the optical unit is a combination of an electrostatic lens with a further component for influencing the particle beam in the region of the electrostatic lens.

In FIGS. 1 to 12 several embodiments of electrostatic lens are disclosed. FIGS. 13 to 21 relate to the optical unit and FIG. 22 shows a particle beam device with such an optical unit.

FIGS. 1 and 2 show an electrostatic lenses for influencing a particle beam, consisting or a first electrode 2 and a second electrode 3 which are disposed one behind the other or downstream in the direction of the particle beam and can each be charged with a potential. The two electrodes 2, 3 are in electrical contact with a high-resistance body 4 which has a channel 5 for the particle beam. In the illustrated embodiment this channel also extends through the two electrodes 2 and 3.

The material of the high-resistance body 4 has a specific resistance between $10^5$ and $10^{11}$ $\Omega$cm, preferably between $10^7$ and $10^9$ $\Omega$cm. A suitable material is for example Murflor Bronze (PTFE-CuSn).

If the specific resistance were chosen too high there would be a danger that the body 4 would be charged with particles which strike the surface, i.e. the wall, of the channel 5. On the other hand, a resistance which is too low would give rise to very large currents and thus a very high power consumption.

The two electrodes 2, 3 are attached, for example as planar electrodes, each on one end face 4a, 4b of the high-resistance body 4. The mounting can be achieved for example by pressing or vapour depositing.

In addition to the two end faces 4a, 4b, the high-resistance body 4 is delimited by an inner wall 4c and an outer wall 4d. The inner wall 4c simultaneously forms the wall of the channel 5.

Each of the two electrodes 2, 3 is charged with a potential $V_2$, $V_3$ respectively, as shown schematically in FIG. 2. The application of voltages causes a current to flow through the body 4, which in turn gives rise to a distribution of potential on the surface of the body 4. The electrostatic field resulting therefrom in the channel 5 is determined not only by the applied voltages $V_2$, $V_3$ and the shape of the two electrodes 2, 3, but also by the shape and wall thickness of the high-resistance body 4.

The high-resistance body can be made from electrically isotropic material in which the specific resistance has the same value in each direction. When anisotropic material is used for the high-resistance body use can be made or the fact that for example the specific resistance in the Z direction is different from the specific resistance in the X and Y directions. The use of anisotropic material can give rise to certain effects and properties of the electrostatic lens. Thus for example a high specific resistance in the Z direction causes a low current and thus a low power consumption within the high-resistance body. A low resistance in the X and Y directions causes a more uniform distribution of potential in this plane. However, with anisotropic material special asymmetries could also be achieved which produce new and as yet unknown properties.

The high-resistance body 4 advantageously has a cladding 14 of electrically insulating material, as is shown schematically in FIG. 2. In certain applications it is also advantageous to provide an electrical shielding.

The high-resistance body shown in FIGS. 1 and 2 is constructed as a rotating body with a cross-section in the shape of a truncated cone, but within the scope of the invention other shapes are also conceivable in order to generate a desired field distribution.

In the following description of FIGS. 3 to 5 various embodiments of the high-resistance body and the effects thereof on the construction of the electrical field are explained in greater detail.

Figure 3:
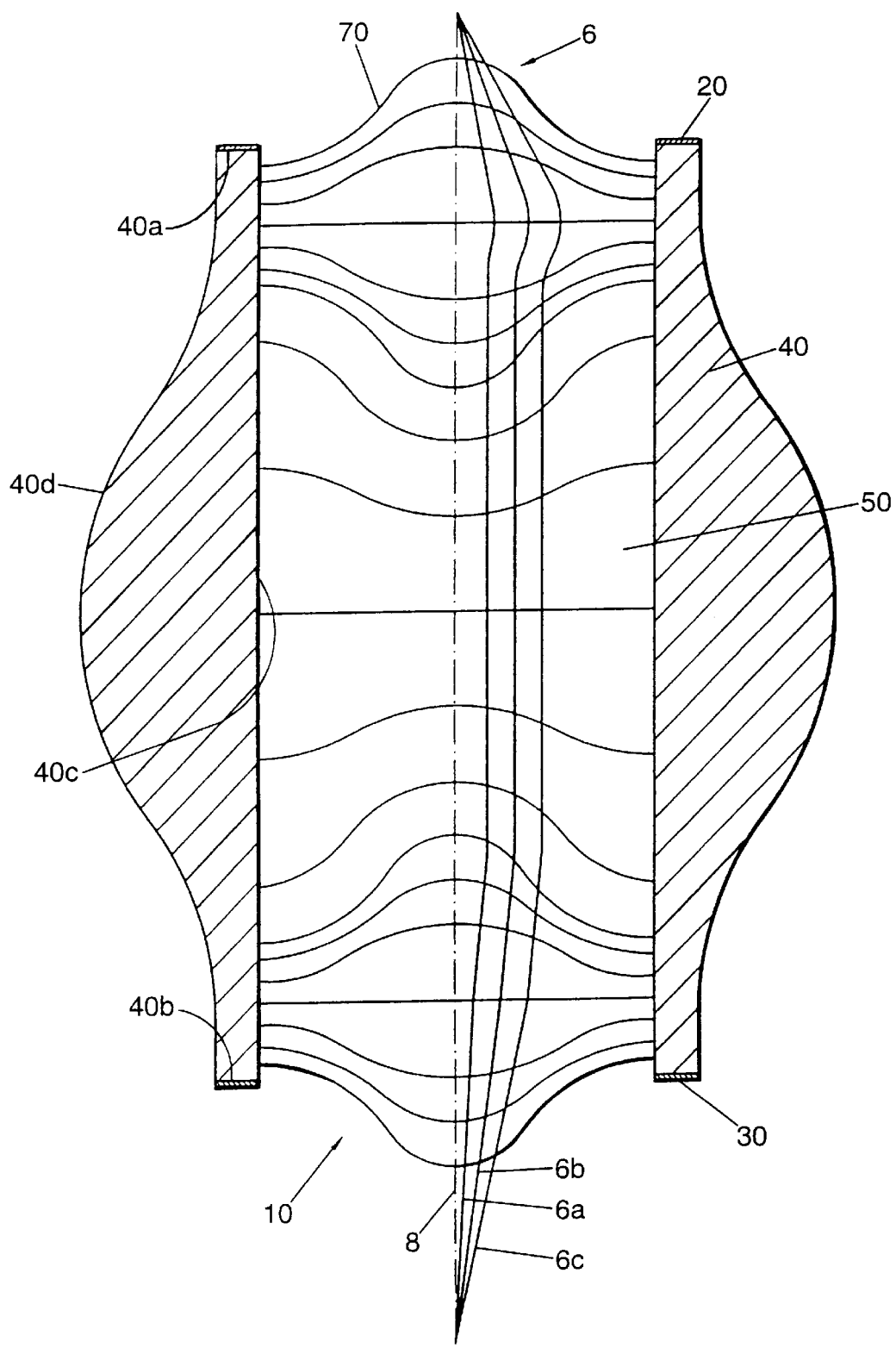

In FIG. 3 an electrostatic lens 10 is shown which is delimited in the direction of the optical axis 8 by an upper and a lower end face 40a, 40b as well as an inner and an outer wall 40c, 40d. The inner wall 40c is substantially cylindrical, whilst the outer wall 40d bulges between the two end faces.

In this embodiment the wall thickness of the high-resistance body 40 tapers continuously from the centre to the two end faces 40a, 40b.

A first electrode 20 is in electrical contact with the end face 40a end a second electrode 30 is in electrical contact with the end face 40b. If the two electrodes 20, 30 are charged with different potentials the electrical field shown in FIG. 3 by field lines 70 is produced in the region of the channel 50.

The effect or this field on a particle beam 6 is represented in relation to three part-beams 6a, 6b, 6c. Although the electrostatic arrangement 10 contains in addition to the high-resistance body 40, only two electrodes 20, 30 which can be charged with different potentials, a field distribution is produced which corresponds to the effect of two lenses each disposed in the region of the two end faces 40a, 40b. If it were wished to achieve such a field distribution in the conventional manner, a plurality of electrodes which can be charged with different potentials would have to be provided for each of these two "lenses".

Figure 4:
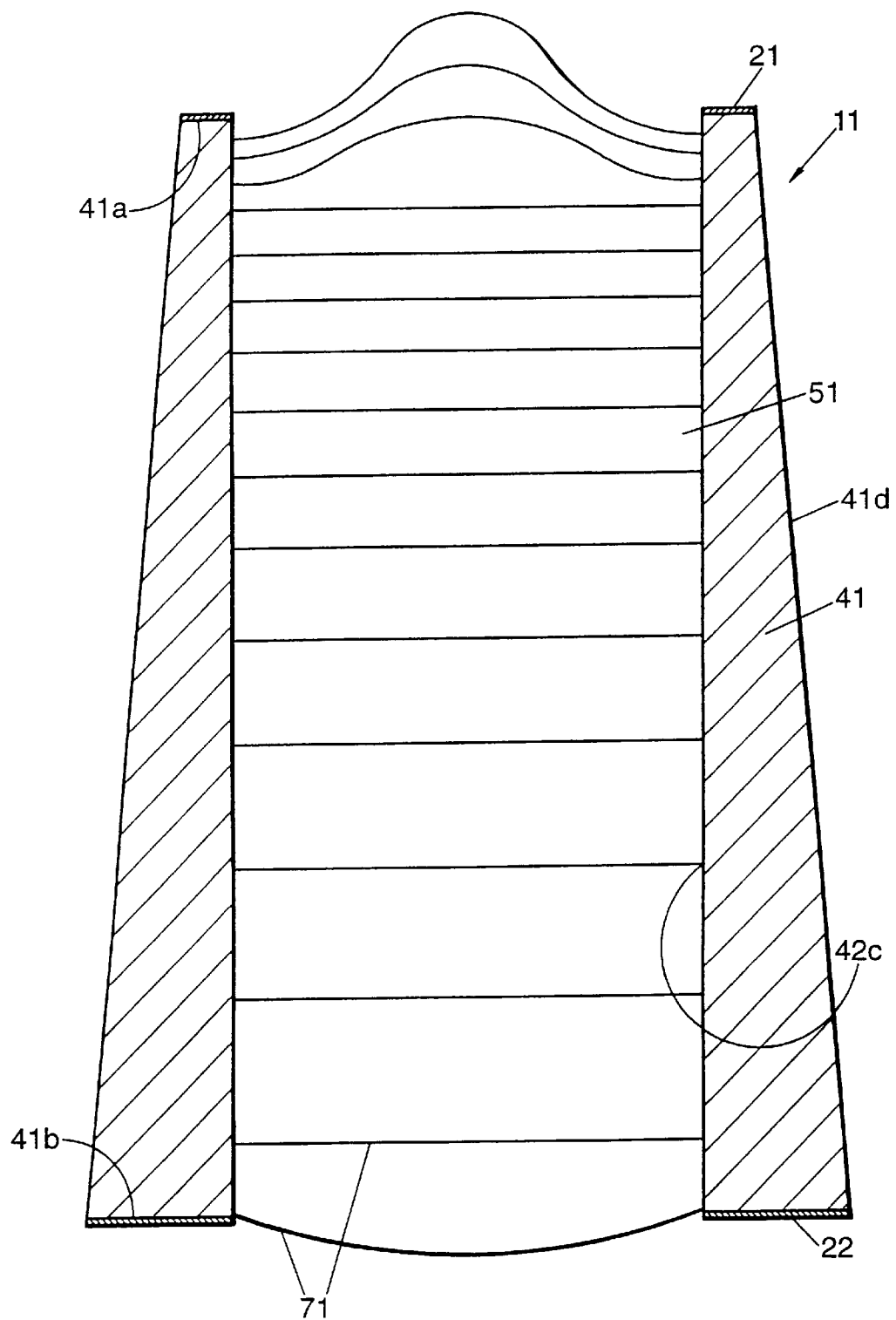

FIG. 4 shows a further embodiment of an electrostatic lens 11, consisting of a high-resistance body 41, a first electrode 21 and a second electrode 22. The inner wall 41c delimits a channel 51 which tapers conically in the direction of the particle beam. Externally the high-resistance body 41 is again presented as a truncated cone, the external diameter increasing in the direction of the particle beam. Based on this, the well thickness of the high-resistance body 41 also increases from its upper end face 41a to its lower end face 41b.

Charging of the two electrodes 21, 22 with a different potential produces an electrical field which is represented schematically by field lines 71.

Figure 5:
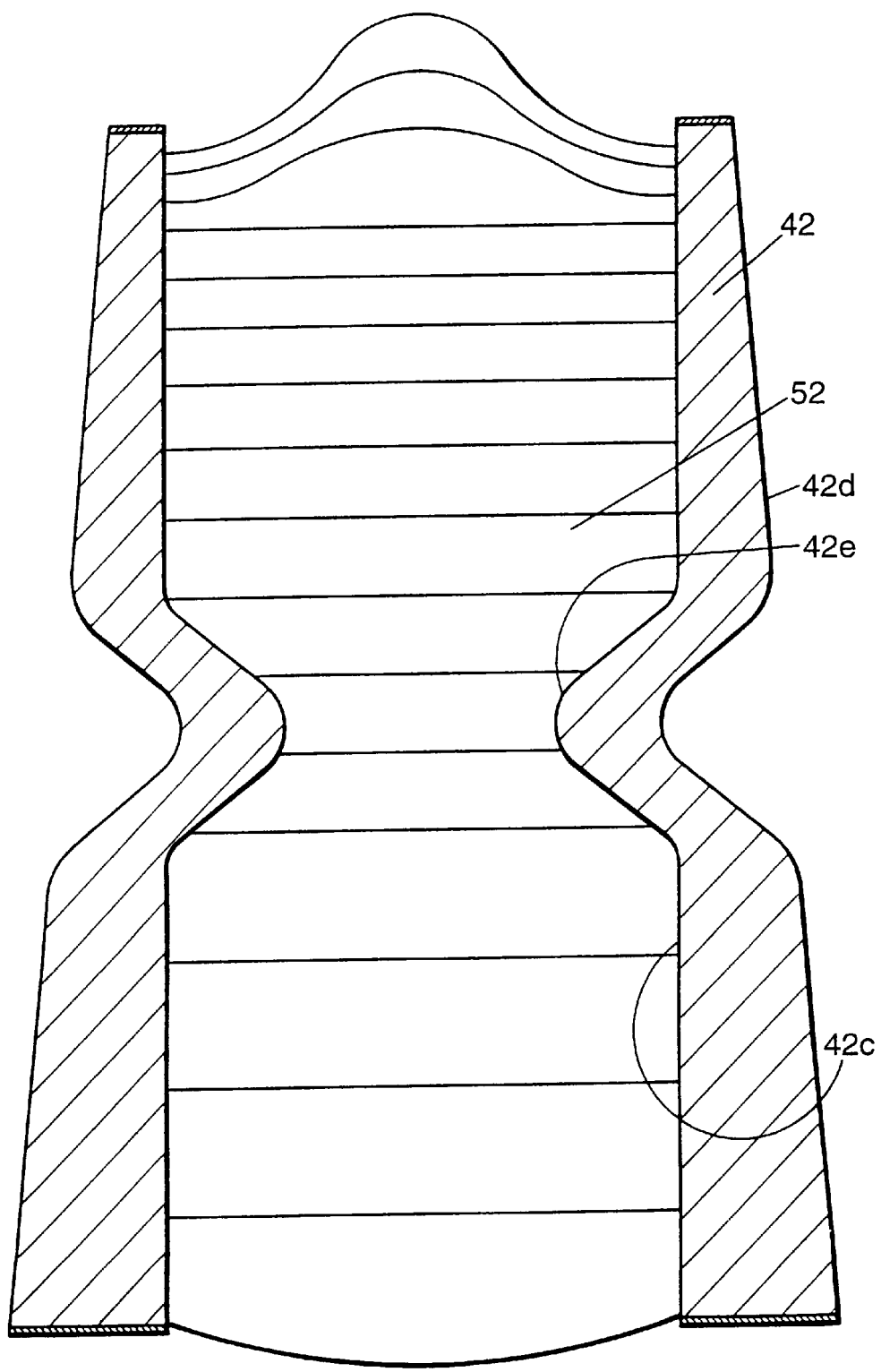

The high-resistance body 42 illustrated in FIG. 5 has an inner wall 42c which has a convexity 42e approximately in the middle which forms a kind of "throttle point" of the channel 52. The outer wall 42d is correspondingly constricted in this region.

Figure 6:
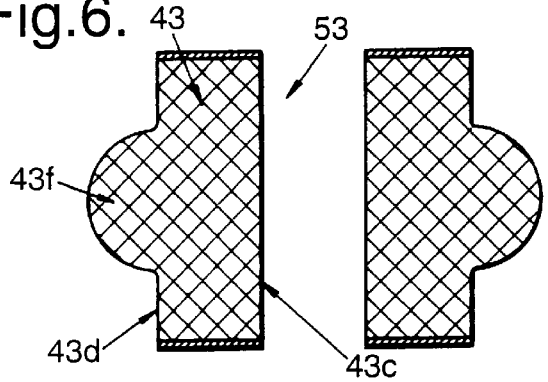
Figure 7:
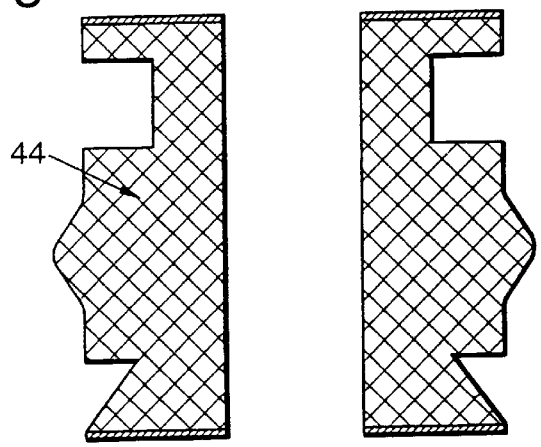

A further embodiment is illustrated in FIG. 6, in which the high-resistance body 43 has a substantially cylindrical inner wall 43c and a substantially cylindrical outer wall 43d which has a convexity 43f approximately in the middle Ultimately there are no limits to the shape of the high-resistance body. Thus, relatively complex shapes could certainly be produced for the formation of a certain electrical field, as is shown by the high-resistance body 44 in FIG. 7.

Figure 8:
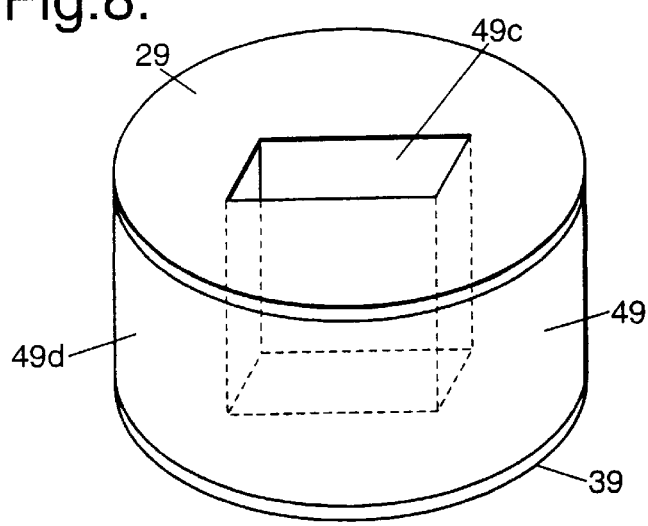
Figure 9:
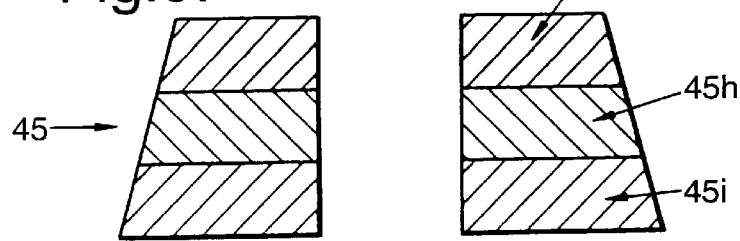

Whereas in the previous embodiments the high-resistance body is constructed as a rotating body, in FIG. 8 a high-resistance body 49 is shown which does indeed have a cylindrical outer wall 49d but in which the inner wall forms a channel which is rectangular in cross-section. Naturally, constructions which are not rotationally symmetrical are also conceivable for the outer wall.

Apart from an alteration in the shape of the high-resistance body, the electrical field can also be influenced by an alteration in the material from which it is made. Thus the high-resistance body 45 shown in FIG. 9 consists of three part-bodies 45g. 45h and 45i which are adjacent to one another in the direction of the particle beam, at least those part-bodies which are adjacent to one another being made from different high-resistance materials. The use of material with different specific resistance suggests itself particularly when it is not already possible to achieve a desired distribution of potential by an alteration in the geometry of the high-resistance body. If for example a rapid change in the wall thickness of a multiple order of magnitude is necessary, the use of a material with another specific resistance might be more advantageous. However, it is also conceivable to provide for a change of material not only in the Z direction, i.e. in the direction of the particle beam, but also in the radial direction. Naturally a combination in both directions is also possible.

Figure 10:
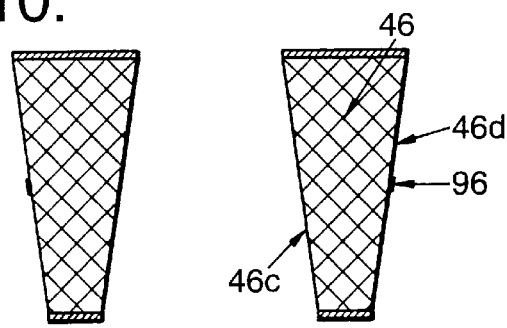

A further possibility for shaping the electrical field which is formed is to provide additional electrodes. In FIG. 10, therefore, an additional electrode 96 is applied as a metal ring on the outer wall 45d of the high-resistance body 46. By means of the additional electrode a stabilisation of the voltage distribution can be achieved with the generation of equipotential lines about the high-resistance body. A potential may also be applied to this electrode. However, such a ring electrode could also be provided on the inner wall 46c.

In FIG. 11 the additional electrode 97 is constructed as a planar electrode which extends from inner well 47c of the high-resistance body to the outer wall 47d and is disposed between the two outer electrodes 27 and 37. This additional electrode 97 is likewise supplied with a potential, so that the electrostatic arrangement acts for example in the upper part as an accelerating lens and in the lower part as a retarding lens.

Within the scope of the invention it is not essential for both electrodes to be provided on the end face or the high-resistance body. Thus at least one of the two electrodes can also be provided for example as a ring electrode on the outer wall.

In the variant illustrated in FIG. 12 one electrode 28 is provided on the end face of the high-resistance body 48 and the other electrode 38 is provided in the interior thereof. In this way a constant distribution of potential is achieved below the electrode 38 on the surface of the high-resistance body 48.

The electrostatic arrangement as described by way of example in FIGS. 1 to 12 is combined with a further component for influencing a particle beam, thus forming an optical unit.

Some embodiments of such optical units illustrated in FIGS. 13 to 21 are described below, where the configuration of the electrostatic lens 1 should be understood as merely by way of example and in particular can be replaced by an electrostatic arrangement according to one of FIGS. 1 to 12.

FIG. 13 shows a first optical unit 200, in which the electrostatic lens is combined with two deflecting electrodes 210, 211 which are for example disposed opposite one another on the outer surface of the high-resistance body 4. Each of the two deflecting electrode s 210, 211 is connected to a variable voltage source, a deflection of the particle beam being achieved by application of a suitable voltage.

However, the combination of an electrostatic lens with a deflector can also be achieved in another way, as is shown by the optical unit 201 in FIG. 14. Here electrodes 2 and 3 are again disposed on the end faces of the high-resistance body. Furthermore, two electrodes 212, 214 are provided on one end face and lie opposite two electrodes 213, 215 on the other end face. In the region of these further electrodes 212 to 215 the ring-shaped electrodes 2, 3 are correspondingly interrupted and isolated. In each case one electrode on one end face and the opposing electrode on the other end face are each connected to a voltage source so that a current $I_{x1}$ flows through the high-resistance body 4 between the electrodes 212 and 213 and a current $I_{x2}$ flows through the high-resistance body 4. The two currents $I_{x1}$ and $I_{x2}$ produce a voltage drop along the z axis which coincides with the optical axis 8. The potential drop produced in this way effects a deflection field over the entire length of the body.

In the optical unit 202 shown in FIG. 15 the electrostatic lens 1 is provided with a plurality of electrodes 216 which can be supplied with voltage and which are likewise disposed along an equipotential line on the surface of the high-resistance body 4. These electrodes can act as a stigmator by means of corresponding electrical circuitry.

Instead of an electrostatic deflecting system the electrostatic lens 1 can also be combined with a magnetic deflecting system to form an optical unit 203, as is indicated schematically in FIG. 16.

The electrostatic unit 1 can be assembled particularly advantageously with a magnetic lens 217 to form an electrostatic-magnetic objective lens 204, as shown in FIG. 17.

In FIGS. 18 and 19 an optical unit 205 is shown which comprises an electrostatic lens with a detector 103. This detector 103 is fixed on the inner wall 4c of the high-resistance body 4 approximately in the middle of the channel 5 and is of ring-shaped construction.

In a particle beam device such a detector 103 serves for example for detection of the secondary particles triggered on a specimen which strike this detector and there give rise to a current $i_{Det}$.

In FIGS. 20, 21 a second embodiment of an optical unit 206 is shown in which the detector 103' is divided into four segments 103'a, 103'b, 103'c and 103'd. On the segments the secondary particles give rise to currents $i_{Det1}$, $i_{Det2}$, $i_{Det3}$, etc., which can be separately processed and evaluated.

Whereas in the embodiments illustrated in FIGS. 18 to 21 the detector protrudes into the channel 5 from the inner wall 4c of the high-resistance body, there are naturally also conceivable solutions in which the detector is inserted in a corresponding recess in the wall 4c.

The compact construction of the electrostatic lens 1 and the simple possibility of combining it with further components for influencing the particle beam is particularly advantageously suited to use in particle beam devices where there is often only relatively little space available for installation.

FIG. 22 shows a particle beam device 100 with essentially a source 101 for generating a particle beam as well as means for influencing the particle beam between the source 101 and a specimen 102 to be examined. These means include in particular an electrostatic lens, for example according to one of the previously described embodiments.

A detector 103 is also provided in order to receive the particles triggered on the specimen 102. In this cease the detector can be disposed according to choice before, behind or even in the electrostatic lens 1. In the illustrated embodiment the detector is placed before the electrostatic lens 1 in the direction of the particle beam. In addition to further apertures and diaphragms a blanking unit 104 is also shown. A deflecting system 105 serves to deflect the particle beam on the specimen 102.

The electrostatic lens according to the invention is particularly well suited for use of the particle beam device in the low-voltage range because of its low chromatic and spherical aberration coefficients. Since the high-resistance body 4 is made from non-magnetic material, the electrostatic lens is particularly suitable for combination with superimposed magnetic fields. Moreover, due to the compact construction of the electrostatic lens this can be disposed very close on or in the gap or a magnetic lens, as is shown in FIGS. 17 and 22. Even better lens properties can be achieved by such an arrangement. Naturally the electrostatic lens can also be combined with a magnetic lens or another arrangement which generates a magnetic field without an iron circuit.

In the case of electron beam applications and here in particular in the case of low-voltage applications the source 101 is preferably constructed as a field emission cathode or photocathode or as a thermal cathode.

Due to its construction the electrostatic lens can be used particularly advantageously as a link between vacuum and ambient air. In this way the vacuum arrangement can be simplified considerably. In the electrostatic lens all supplies of voltage and potential can take place in a simple manner from outside, whilst the channel functions as a beam tube.

We claim:

1. An optical unit for influencing a particle beam comprising an electrostatic lens having a first electrode and a second electrode downstream of said first electrode in the direction of the particle beam, each of said electrodes being chargeable with a potential and each of said electrodes being in electrical contact with a high-resistance body having opposite end faces and a channel through said body for the particle beam, said high-resistance body comprising at least two parts formed of different high-resistance materials adjacent one another in the direction of the particle beam; and a further component in the region of the electrostatic lens for influencing or detecting the particle beam.

2. The optical unit as claimed in claim 1 wherein the material of the high-resistance body has a specific resistance between $10^6$ and $10^{11}$ $\Omega$cm.

3. The optical unit as claimed in claim 1 wherein the electrodes are disposed on opposite end faces of the high-resistance body.

4. The optical unit as claimed in claim 1 wherein the high-resistance body is constructed for rotation.

5. The optical unit as claimed in claim 1 wherein the high-resistance body has an alteration in its cross-sectional surface over its length in the direction of the particle beam.

6. The optical unit as claimed in claim 1 wherein the electrostatic lens is operable to generate an electrical field and the high-resistance body has a shape which influences said electrical field.

7. The optical unit as claimed in claim 1 wherein the high-resistance body is delimited in the direction of the particle beam by an upper and a lower end face and transversely with respect to the particle beam by an inner wall and an outer wall.

8. The optical unit as claimed in claim 1 wherein the high-resistance body is delimited transversely with respect to the particle beam by a wall having inner and outer surfaces and a thickness between the inner and outer surfaces which varies over the length of said body.

9. The optical unit as claimed in claim 1 wherein the high-resistance body is delimited transversely with respect to the particle beam by an inner wall and an outer wall and wherein the inner wall and the outer wall are shaped relative to one another to produce a selected electrical field.

10. The optical unit as claimed in claim 1 wherein at least one of the electrodes is disposed on an outer wall of the high-resistance body.

11. The optical unit as claimed in claim 1 wherein at least one of the electrodes is embedded in the high-resistance body.

12. The optical unit as claimed in claim 1 including at least a third electrode on said body.

13. The optical unit as claimed in claim 1 wherein the high-resistance body is made from electrically anisotropic material.

14. The optical unit as claimed in claim 1 wherein the high-resistance body has a cladding of electrically insulating material.

15. The optical unit as claimed in claim 1 wherein the high-resistance body is surrounded by electrical shielding.

16. The optical unit as claimed in claim 1 wherein the electrostatic lens is operable to focus the particle beam.

17. The optical unit as claimed in claim 1 wherein the further component is in contact with the high-resistance body.

18. The optical unit as claimed in claim 1 wherein the further component is formed by a plurality of electrodes disposed at the same height on an outer wall of the high-resistance body.

19. The optical unit as claimed in claim 1 wherein the further component is formed by additional electrodes on the end faces of the high-resistance body.

20. The optical unit as claimed in claim 1 wherein the further component is formed by a magnetic lens which generates a magnetic field superimposed on the electrostatic lens.

21. The optical unit as claimed in claim 1 wherein the further component comprises a deflector for the particle beam.

22. The optical unit as claimed in claim 1 wherein the further component comprises a detector.

23. The optical unit as claimed in claim 1 wherein the further component comprises a plurality of poles.

* * * * *

UNITED STATES PATENT AND TRADEMARK OFFICE
CERTIFICATE OF CORRECTION

PATENT NO. : 6,051,838
DATED : April 18, 2000
INVENTOR(S) : Jurgen Frosien et al It is certified that error appears in the above-identified patent and that said Letters Patent is hereby corrected as shown below:

Column 2, line 31, change the centered heading "BACKGROUND OF THE INVENTION" to -- DETAILED DESCRIPTION --.

Column 3, line 53, change "or" to -- of --.

Column 4, line 60, change "well" to -- wall --.

Column 5, line 2, change "or" to -- of --; line 20, change "arrangement" to -- lens --; same line, after "to" insert -- a selected --; line 25, change "electrode s" to -- electrodes --.

Column 6, line 23, change "cease" to -- case --;

Signed and Sealed this

Thirteenth Day of March, 2001

Attest:

NICHOLAS P. GODICI

Attesting Officer

Acting Director of the United States Patent and Trademark Office